United States Patent
Aigner et al.

(10) Patent No.: US 7,439,824 B2
(45) Date of Patent: Oct. 21, 2008

(54) BULK ACOUSTIC WAVE FILTER AND METHOD FOR ELIMINATING UNWANTED SIDE PASSBANDS

(75) Inventors: Robert Aigner, Unterhaching (DE); Stephan Marksteiner, Neubiberg (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/069,715

(22) Filed: Mar. 1, 2005

(65) Prior Publication Data

US 2005/0200433 A1  Sep. 15, 2005

(30) Foreign Application Priority Data

Mar. 9, 2004  (EP) ............................. 04005574

(51) Int. Cl.
*H03H 9/00* (2006.01)
*H03H 9/56* (2006.01)
*H03H 9/205* (2006.01)

(52) U.S. Cl. ........................ 333/187; 333/189

(58) Field of Classification Search ................. 333/187, 333/188, 189, 190, 191, 192; 310/335
See application file for complete search history.

(56) References Cited

U.S. PATENT DOCUMENTS

| | | | |
|---|---|---|---|
| 6,107,721 A | 8/2000 | Lakin | 310/321 |
| 6,323,744 B1 * | 11/2001 | Barber et al. | 333/189 |
| 6,407,649 B1 * | 6/2002 | Tikka et al. | 333/133 |
| 6,441,649 B1 * | 8/2002 | Martin et al. | 327/52 |
| 6,441,703 B1 | 8/2002 | Panasik | |
| 6,518,860 B2 * | 2/2003 | Ella et al. | 333/189 |
| 6,566,979 B2 | 5/2003 | Larson, III | |
| 6,603,241 B1 * | 8/2003 | Barber et al. | 310/335 |
| 6,657,517 B2 | 12/2003 | Barber et al. | 333/187 |

FOREIGN PATENT DOCUMENTS

WO  WO 02/095939  11/2002

OTHER PUBLICATIONS

Lakin, K.M. et al.; "Thin Film Resonator Technology"; Microelectronics Research Center; 41st Annual Frequency Control Symposium, 1987.

* cited by examiner

*Primary Examiner*—Dean O Takaoka
(74) *Attorney, Agent, or Firm*—Coats & Bennett, P.L.L.C.

(57) ABSTRACT

A bulk acoustic wave (BAW) filter (40) is fabricated from thin film bulk acoustic wave resonators and a method eliminates unwanted side passbands. This BAW filter comprises a substrate (14) a resonator section (11) and an acoustic mirror section (12). Further it comprises a detuning component (31) positioned in the resonator section (11) to provide precise passband characteristics and an additional detuning component (41) in the acoustic mirror section (12) to suppress unwanted side-passband characteristics.

25 Claims, 7 Drawing Sheets

BULK ACOUSTIC WAVE FILTER AND METHOD FOR ELIMINATING UNWANTED SIDE PASSBANDS

PRIORITY

This application claims priority to European Patent Application No. EP 04005574.1 which was filed Mar. 9, 2004.

TECHNICAL FIELD OF THE INVENTION

The present invention generally relates to a bulk acoustic wave filter such as lattice filters or ladder filters fabricated from solidly mounted thin film bulk acoustic wave resonators and a method for eliminating unwanted side passbands in the filter response.

DESCRIPTION OF RELATED ART AND BACKGROUND OF THE INVENTION

As shown in FIG. 1, a solidly mounted or acoustic mirror type thin film bulk acoustic wave resonator filter 10 of the state of the art includes a resonator section 11 based on a piezolayer 19 of piezoelectric material, such as ZnO or AlN, and includes an acoustic mirror 12, all mounted on a substrate 14 made for example, from glass. The thin film bulk acoustic wave resonators 16, 18 convert sound waves to electric signals, and vice versa, and can be used as a filter in electronic circuits because of its frequency dependent electrical impedance.

Typically, the acoustic mirror 12 of the thin film bulk acoustic wave resonator filter 10 is formed from a combination of reflecting layers 24 to 30 of materials of differing acoustic impedance. An acoustic mirror 12 is built up on the substrate 14 by depositing its various layers 24 to 30 of different materials so as to form a stack of reflecting layers 24 to 30 of different materials on the substrate 14. Next, a bottom electrode 20, 32 is deposited on the acoustic mirror 12, and the piezolayer 19 of piezoelectric material is then deposited on the bottom electrode 20, 32 forming a so called piezolayer 19. Finally, a top electrode 21, 33 is deposited on the piezolayer 19. The combination of top and bottom electrodes 21, 20; 33, 32 and the piezolayer 19 is called the resonator section 11 of the device. The acoustic mirror 12 serves to reflect acoustic waves created by the resonator section 11 in response to a voltage applied to the piezolayer 19 across the electrodes 20, 21; 32, 33, thereby acoustically isolating the substrate 14 from the piezolayer 19.

What is fundamentally required from the reflecting layers 24 to 30 is to have a good reflection of acoustic energy created in the piezoelectric material, such that this energy does not leak out of the resonator, ultimately causing an undesired loss of energy.

The mechanical resonance frequency of a thin film bulk acoustic wave resonator filter 10 is determined by the time it takes the acoustic wave to make a trip from the top surface to the bottom, undergo a reflection, and return to the top. The thinner the device, the faster the wave returns. In a simplified view, the resonance, or sympathetic vibration, occurs at the frequency where a wave being input into the device constructively adds to the wave introduced in the previous cycle, but which has now returned to its original location. Thus the resonance frequency of the bulk acoustic wave resonator is set by the thickness and properties (i.e., speed, density) of the films deposited.

Bulk acoustic wave resonators are used as components for bandpass filters in e.g. the RF-section of a mobile phone.

Such a filter may be a so-called ladder filter but can also be of the lattice type. A ladder filter, for example shown in FIG. 10, includes at least one so-called L-section, an L-section including a series resonator 22 and a shunt resonator 23 and thus consisting of an even number of resonators. In some applications, however, a filter consists of an odd number of resonators. For example, a 2½-stage filter could have either two series resonators 22 and three shunt resonators 23, or three series resonators 22 and two shunt resonators 23.

To create a bulk acoustic wave passband filter from such thin film bulk acoustic wave resonators, the shunt and series bulk acoustic wave resonators 22, 23 are manufactured so as to resonate at different frequencies (typically, but not necessarily with all the series bulk acoustic wave resonators 22 at one frequency, and all the shunt bulk acoustic wave resonators 23 at another). This is established by increasing the acoustic thickness of the shunt bulk acoustic wave resonators layer stack 23 as shown in FIG. 1 and corresponding description. Typically, the shunt bulk acoustic wave resonator's resonance frequency are reduced by adding a greater thickness $\Delta d_e$ of material to its top electrode 33; for example by or depositing a shunt detuning layer 31 on top of the top electrode 33.

These filter applications of bulk acoustic wave resonators are typically operated in the fundamental, i.e. first order, resonance modes $M_{1R}$, $M_{2R}$ as shown in FIG. 2 since these first order resonances $M_{1R}$, $M_{2R}$ have the strongest coupling to the exciting electric field. Therefore, these first order resonance modes $M_{1R}$, $M_{2R}$ achieve the broadest filter response. However, besides these first order modes $M_{1R}$, $M_{2R}$ other acoustic-modes $M_{1S}$, $M_{2S}$ can be observed. These higher modes $M_{1R}$, $M_{2R}$ in the layer stack of the bulk acoustic wave resonator structure can be excited at higher frequencies. FIG. 2 illustrates this phenomenon and shows an impedance plot of two bulk acoustic wave resonators forming respectively a shunt and a series bulk acoustic wave resonator of a ladder filter. The strong peaks $P_{1S}$, $P_{2S}$ at approximately 1800 MHz correspond to the fundamental resonance modes $M_{1R}$, $M_{2R}$ of the two bulk acoustic wave resonators, 16, 17 shown in FIG. 1, whereas the weak peaks $P_{1S}$, $P_{2S}$ at approximately 2800 MHz correspond to the above mentioned acoustic overmodes $M_{1S}$, $M_{2S}$. The dashed line 34 corresponds to the series bulk acoustic wave resonator 22, whereas the solid line corresponds to the shunt bulk acoustic wave resonator 23 shown in FIG. 1.

It is worth noticing that the over-mode $M_S$ shown in FIG. 3 does not correspond to the second or third or higher harmonics of the first order passband resonance mode $M_R$. Actually the frequency of the acoustic overmode $M_S$ lies between the first order passband resonance mode $M_R$ and the second harmonic resonance mode not shown in FIG. 3. Just as the fundamental resonance modes $M_{1R}$ of the shunt and $M_{2R}$ of the series resonators create the filter passband according to the filter specification, the acoustic resonances $M_{1S}$ and $M_{2S}$ give rise to a "side passband" in the filter response which is shown in FIG. 3 where the corresponding transmission of the bulk acoustic wave passband filter is plotted as a function of the frequency.

Even though this side passband is typically quite narrow-banded and not very pronounced, it may fall into a frequency region in which strict stopband restrictions apply to maintain a proper predetermined filter characteristic in the respective application as shown for example in FIG. 3. Therefore, there is a need for a new bulk acoustic wave filter formed from a plurality of series bulk acoustic wave resonators and shunt bulk acoustic wave resonators, wherein each of said plurality of bulk acoustic wave resonators has a set of resonance frequencies. Thus it is an object of the present invention to provide a bulk acoustic wave filter having suppressed side passbands particularly within the stop band and to provide a method of manufacturing such a bulk acoustic wave filter.

SUMMARY OF THE INVENTION

This object can be achieved by a bulk acoustic wave filter comprising a substrate, carrying a first set of piezoelectric resonator means having a thin film resonator structure comprising a piezolayer; and bottom electrodes and top electrodes; a second set of piezoelectric resonator means having a thin film resonator structure, similar to the first set of resonator means, wherein the fundamental resonance frequency is shifted to lower frequencies by applying at least one differential detuning layer at a position above the piezo median plane, determining the bandwidth $\Delta f$ of the bulk acoustic wave filter, positioned side by side with the first set of resonator means; and acoustic mirror layers positioned between the substrate and the piezoelectric resonator means comprising stacked layers of alternating low acoustic impedance and high acoustic impedance; wherein the thin film bulk acoustic wave resonator filter has an overmode-detuning component in which at least one additional differential layer is applied at a position below the piezo median plane for at least one of the resonators in the first set of piezoelectric resonator means.

The piezolayer can be a layer comprising crystalline CdS, PZT, AlN and/or ZnO. The piezolayer may have a thickness of about one quarter of a wavelength of an acoustic resonance frequency, and wherein the piezo median plane is located at a thickness of about one eighth of the wavelength. A stack of acoustic mirror layers may comprise 2 to 8 low acoustic impedance layers and 1 to 7 high acoustic impedance layers. The stack of acoustic mirror layers may comprise as low acoustic impedance material $SiO_2$ and as high acoustic impedance material one of the group $Si_3N_4$, AlN, Cr, W or Mo. The acoustic mirror layer may have a thickness dm of about one quarter of the wavelength of the acoustic resonance frequency. The overmode-detuning component may provide a mismatch of the thickness of the bottom electrodes beneath the piezo median plane. The overmode-detuning component may provide a mismatch in the thickness beneath the piezo median plane of at least one of the acoustic mirror layers in the regions of the shunt resonator branch and/or the series resonator branch having a thickness mismatch in a range of about one-three-hundredth part to one-fiftieth part of one quarter of the wavelength of the acoustic resonance frequency. The top electrodes and the bottom electrodes may comprise a sandwich structure of at least two layers for each electrode, having a first layer in close contact to the piezoelectric layer and a second layer in close contact to the first layer, wherein the first layer is made of high acoustic impedance material compared to the second layer and the second layer is made of high electrical conductivity material compared to the first layer. The first layer can be made of W, Mo, Ta or Au preferably of W and the second layer can be made of Al, Ag or Cu, preferably of Al. The mismatch between the thickness of the electrodes can be provided by a mismatch of the thickness of the second layer.

The object can also be achieved by a method of producing a bulk acoustic wave filter comprising the steps of providing a substrate; depositing on the substrate stacked layers of alternating low acoustic impedance and high acoustic impedance; performing on top of the acoustic mirror layers a first and a second set of piezoelectric resonator means having bottom electrodes toward the acoustic mirror layers and top electrodes; detuning the bandwidth $\Delta f$ of the bulk acoustic wave filters by shifting a fundamental resonance frequency to lower frequencies by applying at least one differential detuning layer at a position above a piezo median plane; and adding an overmode-detuning component by implementing one additional differential layer at a position below the piezo median plane for at least one of the resonators in the first set of piezoelectric resonator means.

The step of detuning can be performed by thinning the piezolayer by selectively etching piezoelectric material from one of the resonator components to reduce thin film resonator thickness and to determine the bandwidth of the bulk acoustic wave filter. The step of selective etching produces the desired shape of the filter's bandpass response. Each of the thin film resonator can be formed by interposing piezoelectric material between electrodes on a die, wherein the step of detuning includes removing piezoelectric material from regions to form thin film resonator components. The method can be used for detuning thin film resonator filters formed from a plurality of thin film resonator components that are manufactured using thin film techniques on a single substrate and coupled in a network, and may comprise the step of fabricating each of the plurality of thin film resonator components with a required set of differing resonance frequencies to provide a filtering function by increasing the resonance frequency sets of certain thin film resonator components from a global starting value, wherein the step of increasing effected by selectively etching piezoelectric material from the certain thin film resonator components to reduce thin film resonator component thickness, the removal of piezoelectric material up-shifting the resonance frequency sets of certain thin film resonator components having the reduced component thickness with respect to resonance frequency sets of other thin film resonator components in the filter. The plurality of thin film resonator components can be coupled in series and shunt branches of the filter to form the network. The method can be used for detuning a ladder filter formed from a plurality of connected thin film resonator T-cells, each T-Cell containing a plurality of thin film resonator components, coupled in series and shunt branches, each of the thin film resonator components having a set of resonance frequencies, comprising: shifting the set of resonance frequencies of thin film resonator components in the series branches of the T-Cells upward with respect to resonance frequencies in the shunt branch thin film resonator components by removing piezoelectric material from a surface of the series branch thin film resonator components. Each of the thin film resonator components can be formed by interposing piezoelectric material between electrodes on a die, wherein the step of detuning includes removing piezoelectric material from regions which will form series thin film resonator components and/or the die, excluding that piezoelectric material in regions which will form shunt thin film resonator components. The method may be used for detuning a thin film resonator filter formed from a plurality of thin film resonator components electrically connected in series and shunt branches, each of the plurality of thin film resonator components including a piezolayer of piezoelectric material interposed between two electrodes and each thin film resonator component having a set of resonance frequencies, comprising: shifting the set of resonance frequencies of thin film resonator components in the shunt branches of the filter down with respect to the series branch thin film resonator components by depositing additional piezoelectric material in a region which forms the shunt branch thin film resonator components.

The invention provides a bulk acoustic wave filter comprising a substrate. This substrate carries acoustic mirror layers having typically but not necessarily a thickness of about one quarter of said wavelength at said acoustic resonance frequency. The acoustic mirror layers are stacked in an alternating manner of low acoustic impedance and high acoustic impedance layers.

On the uppermost acoustic mirror layer, first and second piezoelectric resonator means are positioned side by side. These piezoelectric resonator means have a thin film resonator structure. Such a thin film resonator structure comprises a piezolayer and bottom electrodes positioned on said uppermost acoustic mirror layer. Top electrodes are positioned on top of said piezolayer. The electrodes of the first piezoelectric resonator means can be electrically connected to a series resonator branch and the electrodes of the second piezoelectric resonator means can be electrically connected to a shunt resonator branch.

A frequency shifting or detuning of the shunt resonators is established by increasing the thickness of the layerstack of the shunt resonator above the piezo median line Lm. This can be done by increasing the piezo-thickness of the shunt resonator or by increasing the thickness of the top electrode or by depositing an additional dielectric layer on top of the shunts top electrode. Alternatively, a corresponding layer of the series resonator can be thinned by appropriate etching means. For simplicity such a layer is referred to as a "differential layer for a certain resonator (respectively a certain subset of resonators)", meaning that it can either be formed by depositing an additional layer only under or over this resonator (respectively subset of resonators) or by thinning a corresponding layer for all other resonators.

Thus the fundamental resonance frequency for at least one of the resonators in the second set of piezoelectric resonator means is shifted to lower frequencies by applying at least one differential detuning layer at a position above the piezo median plane Lm, determining the bandwidth $\Delta f$ of said bulk acoustic wave filter. The first and second set of piezoelectric resonators are positioned side by side. The acoustic mirror layers are positioned between said substrate and said piezoelectric resonator means comprising stacked layers of alternating low acoustic impedance and high acoustic impedance.

Furthermore the thin film bulk acoustic wave resonator filter of the present invention comprises an overmode-detuning component in which at least one additional differential layer is applied at a position below the piezo median plane Lm for at least one of the resonators in the first set of piezoelectric resonator means.

Particularly, the bulk acoustic wave filter has an overmode-detuning component in that a thinning is provided in the thickness of at least one of the layers of the shunt resonator below the piezo median plane Lm. This is most conveniently established by etching a small part of the uppermost low-impedance mirror layer of the shunt resonator or alternatively by depositing a thin additional layer on the uppermost low-impedance mirror layer of the series resonator. This is in strict contrast to the traditional detuning scheme (i.e. for the fundamental resonance mode) since in the method according to the present invention the frequency of the series resonator is lowered with respect to resonance frequency of the shunt resonators. The goal of the traditional detuning scheme is exactly the opposite.

The proposed method is based on a different frequency sensitivity of the fundamental versus the overmode to a change in layer thickness above and below Lm. The fundamental mode is highly sensitive to changes in the layerstack above Lm, whereas the overmode is highly sensitive to changes below Lm. It is thus also possible to establish the overmode-detuning also in one of the other mirror layers, as well as in the bottom electrode.

This bulk acoustic wave filter has the advantage, that the above mentioned overmodes particularly between the first and second order resonance frequencies are suppressed and no side-passband occurs in the stop band region of the required filter specification, particularly for specifications related to mobile phones or to other cellular, wireless or fiber-optic communications as well as in computer or computer related information exchange or information sharing systems.

The present advantageous arrangement of a first and second piezoelectric resonator means alternately in a series and a shunt relationship forms a ladder configuration. The series resonator branch of the first piezoelectric resonator means carries signals from an input toward an output port, whereas the shunt resonator branch of the second piezoelectric resonator means provides an alternative path for the signals to ground. The transmission or blocking characteristics of both series and shunt elements affect the final signal reaching the output port from the input. Although the present invention relates to a passband filter, this suppression behaviour of a detuning by a detuning component according to the present invention is applicable to improve any number of filters requiring a multiplicity of different frequency resonators.

Furthermore the bulk acoustic wave filter of the present invention has the advantage of allowing a precise filtering, particularly in the context of the increasingly crowded radio frequencies spectrum. It meets the strict physical requirements of being extremely robust, being able to be mass produced and being small. Further, it maintains the strict rejection and transmission characteristics by its large stop band attenuation, efficiently cleaning up signals at the front-end of mobile phones by said overmode-detuning component comprising a mismatch of the thickness of the uppermost acoustic mirror layers.

In a preferred embodiment, the piezolayer is a layer comprising polycrystalline CdS, AlN and/or ZnO. These crystalline piezoelectric materials of the piezolayer convert electrical energy to mechanical energy and vice versa such that at its mechanical resonance frequency, the electrical behaviour of the device of the present invention changes abruptly. Electrical signals of particular frequencies easily pass through the resonators of the present bulk acoustic wave filter while others will be stopped successfully and will not be transmitted as a result of the present invention.

A further preferred embodiment of the present invention comprises a stack of acoustic mirror layers having 2 to 8 low acoustic impedance layers and 1 to 7 high acoustic impedance layers, preferably 3 to 5 low acoustic impedance layers and 2 to 4 high acoustic impedance layers. Each layer has a thickness of about a quarter of a wavelength at the acoustic resonance frequency. The higher the number of alternating acoustic mirror layers the sharper the edges of the passband of the bulk acoustic wave filter. The stack of acoustic mirror layers comprises preferably as low acoustic impedance material $SiO_2$ or $Si_3N_4$ and as high acoustic impedance material one of the group, AlN, Cr, W or Mo.

In a further preferred embodiment of a bulk acoustic wave filter of the present invention the top electrodes and the bottom electrodes comprise a sandwich structure of at least two layers for each electrode. A first layer of these layers is in close contact to the piezoelectric layer, while the second layer is in close contact to the first layer. Said first layer of material within each electrode is selected and used to increase the effective coupling coefficient between the piezoelectric layer of material in the resonator and the electric fields resulting from the voltages applied to the electrodes. The second layer of material within each electrode is selected and used to decrease the electrical losses within the electrodes. Therefore the first layer is made of high acoustic impedance material like W, Ta or Au, preferably W compared to the second layer. The second layer is made of a high electrical conductivity material like Al, Ag or Cu preferably Al compared to the first layer.

A method of producing a bulk acoustic wave filter comprises the following steps:

A substrate is provided on which stacked layers of alternating low acoustic impedance and high acoustic impedance are deposited. On top of said acoustic mirror layers a first and a second set of piezoelectric resonator means having bottom electrodes toward the acoustic mirror layers and having top electrodes are manufactured. The bandwidth Δf of said bulk acoustic wave filter is determined by shifting the fundamental resonance frequency of the shunt resonators to lower frequencies by applying at least one differential detuning layer at a position above a piezo median plane (Lm). Furthermore, an overmode-detuning component is added by implementing one additional differential layer at a position below said piezo median plane (Lm) for at least one of the resonators in said first set of piezoelectric resonator means.

A traditional detuning step is applied to create a set of resonance frequencies by thin film resonator components in the series or shunt branches by thinning or thickening predefined areas of the piezoelectric resonator means. Therefore a thinning of a piezolayer from the series resonator branch thin film resonator components to up-shift their set of resonance frequencies with respect to resonance frequencies of said shunt resonator branch thin film resonator components is performed or a thickening of the thickness of top electrodes from the shunt resonator branch thin film resonator components is carried out.

An overmode detuning step of said acoustic overmode resonance frequency is carried out, by performing a thinning in the thickness of at least one of the uppermost acoustic mirror layers in the regions of said shunt resonator branch by thinning this acoustic mirror layer in a range of about one-fiftieth part to one-three-hundredth part of one quarter of the wavelength at said acoustic resonance frequency to detune the acoustic overmode resonance frequency.

This method has the advantage that overmodes, particularly between the first and second order resonance frequencies, are shifted in frequency in such a way that no side-passband occurs in the stop region for the required filter specification particularly of specifications related to mobile phones or to other cellular, wireless or fiber-optic communications as well as in computer or computer related information exchange or information sharing systems.

This method has the additional advantage, that a short thinning step of the uppermost acoustic mirror layer is performed before the deposition of bottom electrodes takes place. This thinning is performed by etching just several Nanometres from the uppermost acoustic mirror layer in the region of the shunt resonator branch to suppress side-passband frequencies in the passband region. Actually the thinning range is between one-three-hundredth part to one-fiftieth part of one quarter of a wavelength at the acoustic resonance frequency. Thinning can easily be performed by wet etching, plasma etching, sputter etching or reactive ion etching. The region of the series resonator branch can be protected by a resist layer during the thinning process of the series resonator branch region.

The step of detuning by enlarging the thickness of top electrodes of the shunt resonator branch has the advantage of being a cost effective method, since this step can be performed as a very last deposition step. Thus it is possible to perform a post- or re-adjustment of the detuning by varying the thickness of these electrodes of the almost finished device to achieve an appropriate determination of bandwidth of the bulk acoustic filter, as pointed out above.

The step of detuning by thinning the piezolayer includes selectively etching piezoelectric material from the series branch thin film resonator components to reduce thin film resonator component thickness, wherein said step of selective etching produces the desired shape of the filter's passband response and determines the bandwidth of said bulk acoustic wave filter. Such a thinning to define the bandwidth of said bulk acoustic wave filter can be performed as soon as the piezolayer is deposited on the bottom electrodes. This thinning is selectively performed in the region of the series resonator branch. During this step of thinning, a thickness difference in the range of one-tenth part to one-twentieth part of the thickness of said piezolayer is etched, which is at least an order of magnitude more than the thinning for the overmode-detuning process. Therefore the detuning requirements to determine the passband width of the bulk acoustic wave filter performed within the piezolayer are not comparable with the overmode-detuning requirements performed within the acoustic mirror layer.

After producing such thin film resonator areas on a substrate, said plurality of thin film resonator components are electrically connected coupled in series and shunt branches of the filter to form a network as for example shown in FIG. 11. This network comprises T-cells, wherein each T-Cell contains a plurality of thin film resonator components coupled in series (110, 140, 160) and shunt branches (130, 150). Each of said thin film resonator components have a set of resonance frequencies. This is achieved by shifting the set of resonance frequencies of the thin film resonator components in the series branches of the T-Cells upward with respect to the resonance frequencies in the shunt branch thin film resonator components, as piezoelectric material from a surface of the series branch thin film resonator components is removed.

An alternative method for detuning a thin film resonator filter is to shift the set of resonance frequencies of the thin film resonator components in the shunt branches of the filter down with respect to the series branch thin film resonator components by depositing additional piezoelectric material in a region which forms the shunt branch thin film resonator components. This method is somewhat different to the detuning methods already discussed, since it is necessary to enlarge the thickness of the piezolayer in the region of the shunt resonator branch of about one-half to one-twentieth of one half of a wavelength of an acoustic frequency resonance. This can be performed by depositing piezoelectric material by chemical vapour deposition or physical vapour deposition. This has to be done prior to the deposition of the shunt electrodes.

BRIEF DESCRIPTION OF THE DRAWINGS

The present invention will become fully understood from the detailed description given herein below and the accompanying drawings, wherein like elements represent like reference numerals, which are given by way of illustration only and thus are not limitative of the invention and wherein.

DETAILED DESCRIPTION OF EMBODIMENTS

Figure 1:
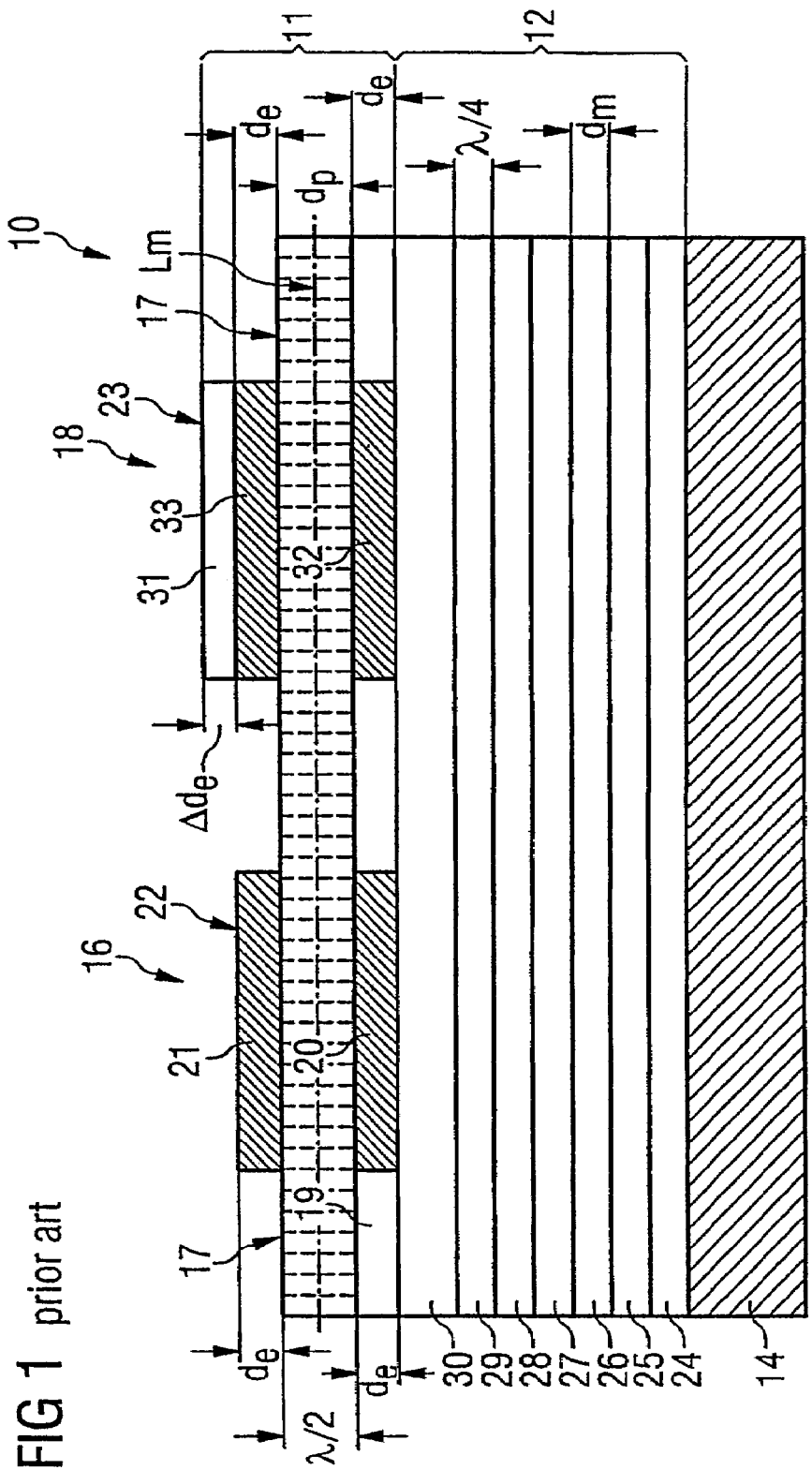
FIG. 1 shows a schematic of an acoustic mirror type bulk acoustic wave resonator filter according to the prior art.
Figure 2:
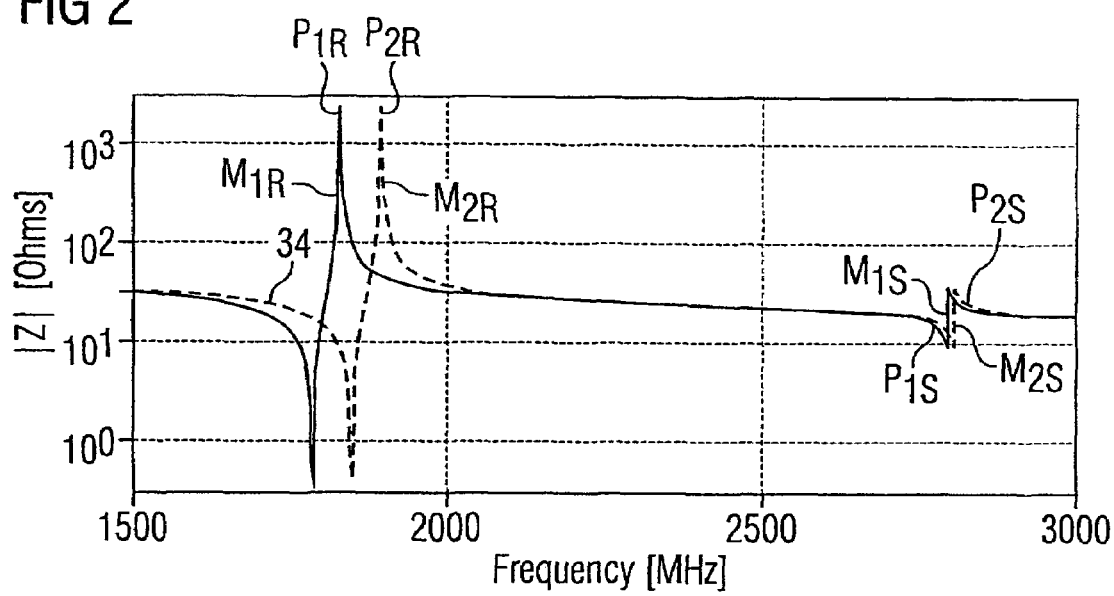
FIG. 2 shows an impedance plot of a series and a shunt bulk acoustic wave resonator forming said bulk acoustic wave passband filter of FIG. 1.
Figure 3:
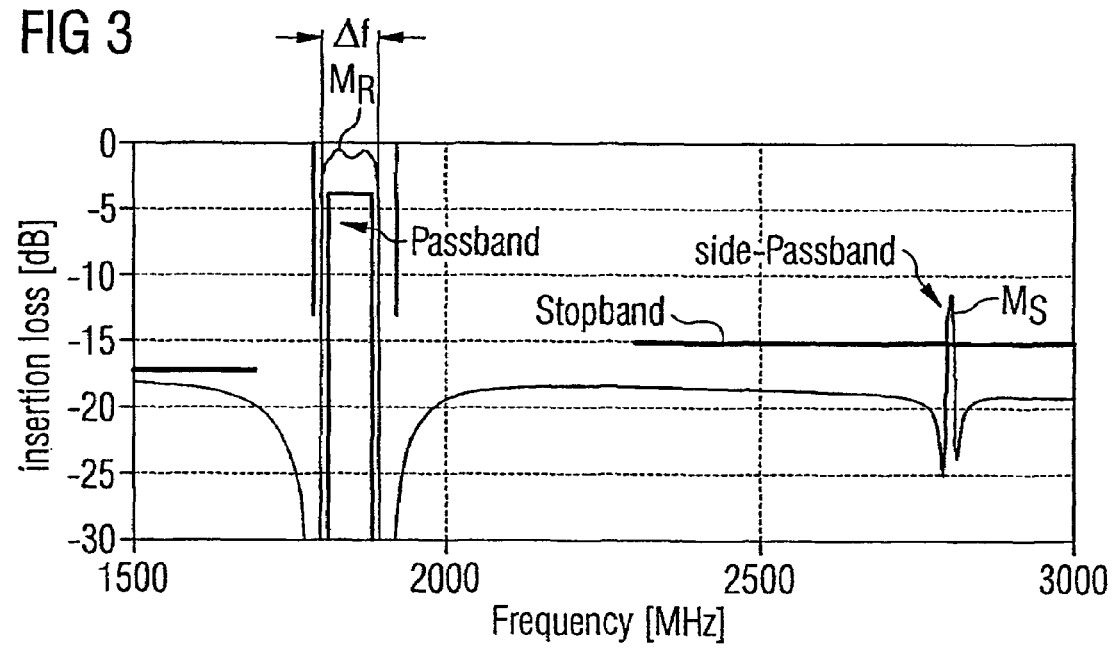
FIG. 3 shows the transmission characteristics for the bulk acoustic wave passband filter of FIG. 1.

FIG. 1 shows a schematic of an acoustic mirror type thin film bulk acoustic wave resonator filter 10 according to the prior art described above and FIG. 2 shows an impedance plot of a series and a shunt bulk acoustic wave resonator 22, 23 forming said thin film bulk acoustic wave resonator filter 10 of FIG. 1. Furthermore FIG. 3 shows the transmission characteristics for said thin film bulk acoustic wave resonator filter of FIG. 1. As can be seen from FIG. 2 and FIG. 3, the acoustic mirror type thin film bulk acoustic wave resonator filter 10 shows an over-mode resonance forming a weak side-passband filter between the first order resonance frequency of the filter and the second harmonic resonance frequency. This side-passband of the filter potentially violates the stop band specifications required for various filter applications. Thus, there is a need for a new bulk acoustic wave resonator filter formed from a plurality of series bulk acoustic wave resonators and shunt bulk acoustic wave resonators.

Figure 4:
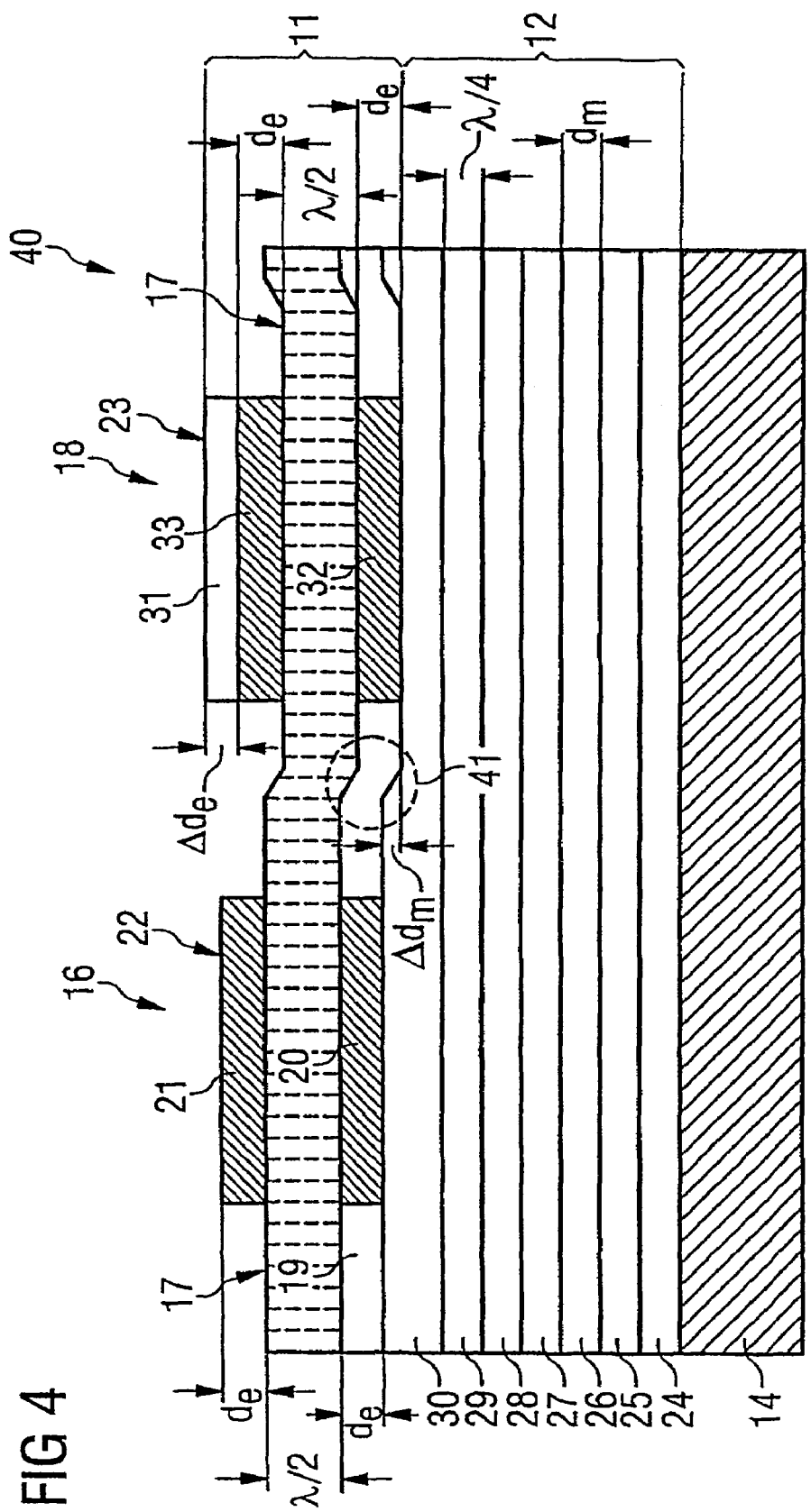
FIG. 4 shows a schematic of an acoustic mirror type bulk acoustic wave resonator filter according to a first embodiment of the present invention.

FIG. 4 shows a schematic of an acoustic mirror type thin film bulk acoustic wave resonator filter 40 according to a first embodiment of the present invention. This thin film bulk acoustic wave resonator filter 40 comprises a substrate 14 on which a stack of acoustic mirror layers 24 to 30 is deposited to form an acoustic mirror 12. Each set acoustic mirror layer 24 to 30 has a thickness dm of about one quarter $\lambda/4$ of a wavelength $\lambda$ at the acoustic resonance frequency. This stack of acoustic mirror layers 24 to 30 consists of four low acoustic impedance layers 24, 26, 28 and 30 and there between three acoustic mirror layers 25, 27 and 29 of high acoustic impedance.

The uppermost acoustic mirror layer 30 of low acoustic impedance comprises an overmode-detuning component 41 providing a mismatch between an area occupied by a first piezoelectric resonator means 16 and second piezoelectric resonator means 18. This overmode-detuning component 41 provides a mismatch $\Delta d_m$ in the thickness dm of the uppermost acoustic mirror layer 30. This thickness mismatch $\Delta d_m$ is in a range of about one-hundredth part to one-twohundredth part of one quarter $\lambda/4$ of said acoustic wavelength $\lambda$. This overmode-detuning component 41 of a thickness difference between the first piezoelectric resonator means 16 and the second piezoelectric resonator means 18 has the effect, that the above-mentioned side-passband filter characteristic is suppressed.

Bottom electrodes 20 and 32 for a series resonator branch 22 and a shunt resonator branch 23 respectively are positioned on this uppermost acoustic mirror layer 30. On top of this bottom electrode a piezolayer 19 is deposited with a thickness of about one quarter $\lambda/4$ of the resonance wavelength $\lambda$ and on top of this piezolayer 19 the known top electrodes 21 and 33 of the series resonator branch 22 and the shunt resonator branch 23 respectively are positioned. To achieve the detuning of the thin film bulk acoustic wave resonator filter 40 the top electrode 33 is covered by a detuning component 31 having a thickness $\Delta d_e$ of one-half down to one twentieth part of the thickness of said top electrode 33. Thus the resonator section 11 of the device of the present invention is identical with the resonator section 11 of the prior art shown in FIG. 1.

Figure 5:
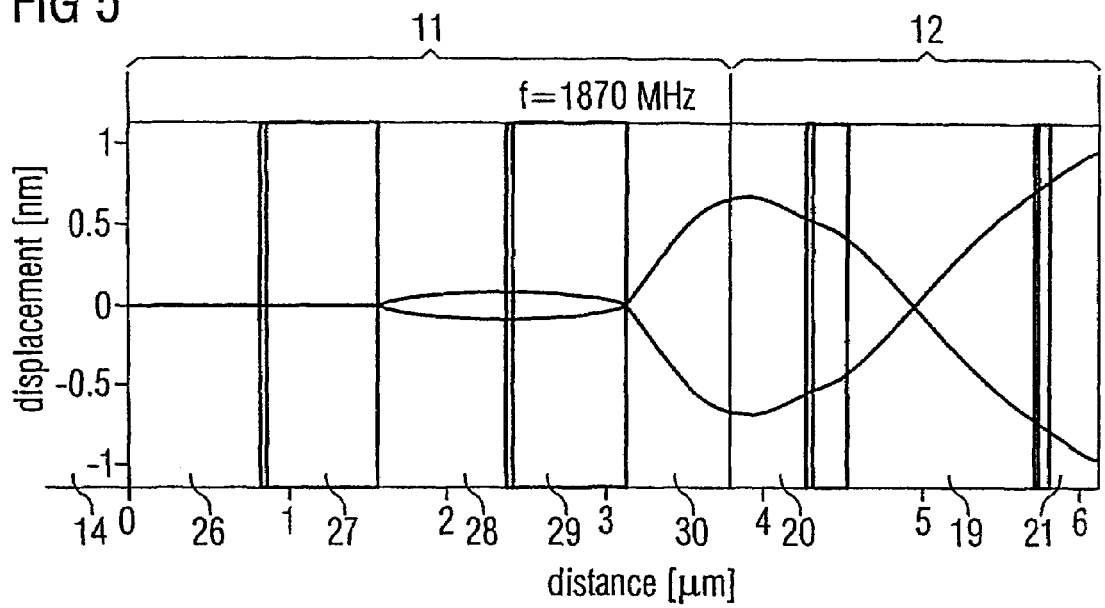
FIG. 5 shows the displacement generated by a bulk acoustic wave within a series resonator in relation to the distance from a substrate at the first resonance frequency of 1870 MHz.

FIG. 5 shows the displacement generated by a bulk acoustic wave within a series resonator as a function of the distance from a substrate 14 at the first resonator frequency of 1870 MHz. The reason for the side pass-band shown in FIG. 3 is that the over-mode resonances of series and shunt resonators 22 and 23 of FIG. 1 show an appropriate frequency-separation that gives rise to the formation of a side-passband. The actual shape of the side-passband is a strong function of this separation, with a minimum insertion loss (or correspondingly a maximum violation of the passband specification) at a separation, where the shunt resonators parallel resonance and the serious resonator serious resonance have approximately the same frequency.

The idea of the present invention is to provide a way to change this frequency separation of the over-modes in such a way, that the resulting side-passband feature does not violate the specification of the particular application, while at the same time the performance of the main passband is undistorted.

Figure 6:
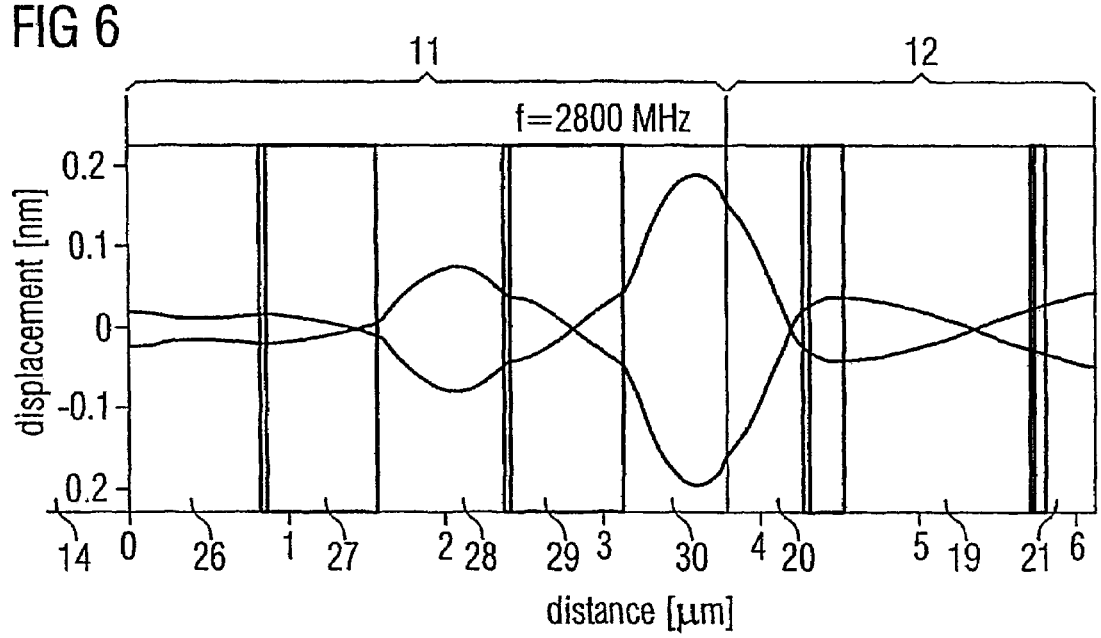
FIG. 6 shows the displacement generated by a bulk acoustic wave within a series resonator in relation to the distance from a substrate at a frequency of an over-mode of 2800 MHz.

FIG. 6 compared to FIG. 5 shows the displacement generated by a bulk acoustic wave within a series resonator as a function of the distance from a substrate 14 at a frequency of an over-mode of 2800 MHz. This comparison clearly reveals that the over-mode comes from an acoustic resonance in the mirror layers themselves rather than from a real over-mode of the fundamental resonance frequency of the piezolayer 19. The real over-mode of the fundamental resonance frequency of the piezolayer 19 is expected at much higher frequencies like the second harmonic resonance at about 3.6 GHz or the third harmonic resonance at about 5.4 GHz.

Actually the unwanted first over-mode resonance at 2.8 GHz is predominately caused by a breathing of the upper two low acoustic impedance mirror layers around the field node at approximately 3 μm from the substrate surface at zero μm. As a consequence of that, the resonance frequency of the unwanted over-mode is a sensitive function of the layer thickness of the various acoustic mirror layers in particular of the uppermost low acoustic impedance mirror layer 30 and the low acoustic impedance mirror layer 28.

Another consequence of this localization of the overmode in the mirror layers is that the over-mode resonance frequency shows very little sensitivity to variations in the thickness of layers of the resonator section 11, particularly layers above the piezo median plan. Furthermore, due to the small resonator bandwidth (or low-coupling) nature of the over-modes, only a rather small overmode-detuning is actually needed in order to give rise to a significant side-passband. There is thus a wide variety of layerstacks and detuning schemes for which the state-of-the-art detuning produces an adapted detuning for both the fundamental modes and the overmodes.

The series resonators and the shunt resonators are detuned to build the required passband by adding an additional detuning component at the top or within the resonator section 11. This detuning component is performed by creating a large thickness difference at the top or within the resonator section 11 and causes the large frequency shift of the first resonance frequency or the fundamental mode necessary to form a precise passband resonance mode $M_R$ with a band width $\Delta f$, shown in FIG. 3, while it leads at the same time to a small shift of the first over-mode that—if not compensated by the method according to the present invention—gives rise to an unwanted overmode side-passband filter $M_S$, shown in FIG. 3.

Since the unwanted side-passband is caused predominately by the low acoustic impedance mirror layer 30 and not by the piezolayer 19 or by the top electrode, it is the idea of the present invention to slightly change the layer thickness of one of the acoustic mirror layers that show a sensitive effect on the over-mode frequency either for the series or for the shunt resonator branch in the thin bulk acoustic wave resonator film. By introducing said overmode-detuning component 41 shown in FIG. 4, the over-mode resonance peak $P_{1S}$ shown in FIG. 2 of the acoustic over-mode $M_{1S}$ of a first order resonance mode $M_{1R}$ of the series resonator branch as shown in FIG. 2 and the over-mode resonance peak $P_{2S}$ of an acoustic over-mode $M_{2S}$ of a first order resonance mode $M_{2R}$ of shunt resonance branch can be moved away from the unfortunate and unwanted case described above. Thus the side-passband can be at least sufficiently suppressed. The effect of the over-mode-detuning component 41 of FIG. 4 on the suppression of an over-mode $M_S$ of a side-passband filter is shown in the next figure.

Figure 7:
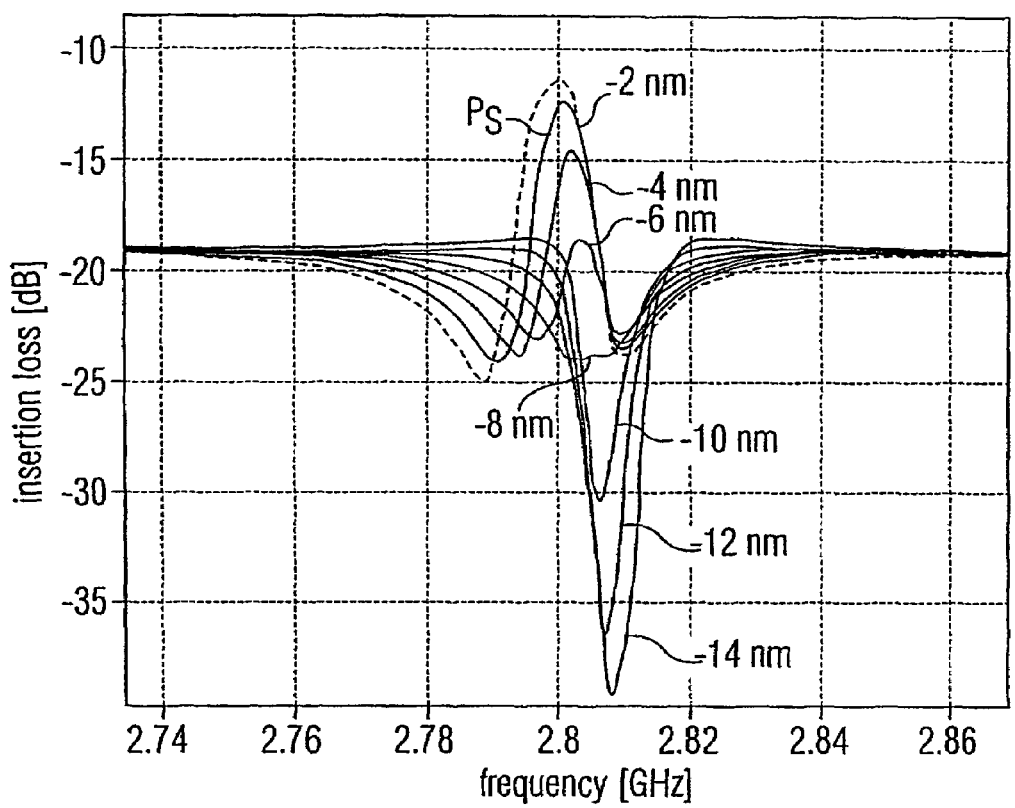
FIG. 7 shows the influence of a mismatch in the range of 2 to 14 nm of the uppermost acoustic mirror layer between the region of the shunt resonator branch and the region of the series resonator branch.

FIG. 7 shows the insertion loss of the side-passband in dB as a function of the frequency in GHz. The insertion loss for the stop band has to be in this case minus 15 dB. FIG. 7 shows now the influence of a thickness mismatch (overmode-detuning component 41) in the range of 2 to 14 nm of the uppermost acoustic mirror layer between the region of the shunt resonator branch and the region of the series resonator branch. As can be seen from this diagram a mismatch of only 4 nm is already sufficient to decrease the side-passband close to the stop band specification. A mismatch of 6 nm of the overmode-detuning component 41 shown in FIG. 4 has already the effect, that the stop band is nevermore violated.

The fundamental difference between the traditional detuning scheme and the overmode-suppressing detuning scheme according to the present invention is that traditional seeks to increase the effective thickness of the shunt layer stack (and thereby lowering its resonance frequency) by either depositing at least one additional layer of material in the region of the shunt resonators or by making at least one of the common layers thicker with respect to the same layer in the series resonators. The scheme proposed by the present invention includes an additional differential layer with the completely reversed thickness strategy (i.e. being thicker for the series resonators) in order to reduce the frequency detuning of the overmodes and ultimately to eliminate the unwanted side-passband in the filter response.

This mismatch can be achieved processing-wise by using a lithographic mask, that opens over those regions that are supposed to have a smaller layer thickness. In a subsequent etching step an appropriate portion of the exposed layer is etched by standard semiconductor processing methods like dry or wet etching or ion beam milling. Finally the resist mask is removed and the production process for a thin film bulk acoustic wave resonator filter is continued in the usual way. Alternatively it is possible to use the resist mask as a lift-off mask in order to deposit an additional thin layer of material on top of the exposed surface region. However, in this case, the mask needs to open the opposite resonator type.

Actually the uppermost acoustic mirror layer 30 of the shunt resonators can be thinned so much that an inversion of the overmode-detuning takes place. Such an inversion results in the fact, that the shunt over-mode frequency is higher than the series over-mode frequency. This case is preferable since it completely eliminates the side-passband filter effect. (cf. FIG. 7 at 14 nm thickness mismatch).

This change of layer thickness of the acoustic mirror layers has also an effect on the detuning of the fundamental resonances of the series and shunt resonators. However this effect is very small since the fundamental resonance frequencies are rather insensitive to these thicknesses of the uppermost acoustic mirror layers and due to the facts that the change in thickness is extremely small. Therefore it is possible to compensate this slight "anti-detuning" by adjusting the thickness of the fundamental-mode detuning layers in the resonator section.

The effect of a thinning of the uppermost acoustic mirror layer on the shape of the side-passband shows in FIG. 7, that already a 6 nm reduction of the layer thickness pushes the peak $P_S$ insertion loss below the stop band of the specification. A further thinning even turns the side-passband further around. An optimum thinning for this particular example is within a range of 10 nm+/−4 nm. This mismatch is achievable by the above mentioned etching processes and has, with +/−4 nm, an acceptable tolerance.

Figure 8:
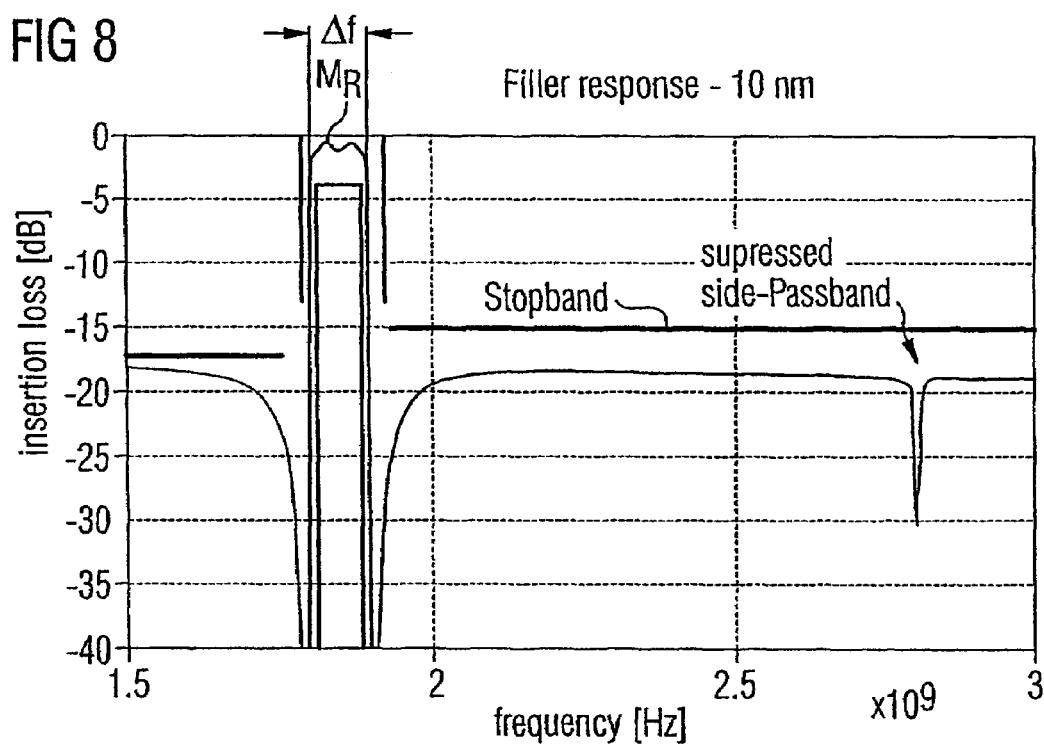
FIG. 8 shows the transmission characteristics for the bulk acoustic wave passband filter of FIG. 4.

FIG. 8 shows the transmission characteristics for the bulk acoustic wave filter of FIG. 4. Again the insertion loss in dB is shown as a function of the frequency in GHz. The stop band is characterised by a horizontal line close to an insertion loss of minus 15 dB. As can be seen from this drawing, the side-passband is suppressed sufficiently by thinning the uppermost acoustic mirror layer 30 shown in FIG. 4 by about 10 nm to create a mismatch in the thickness of the uppermost acoustic mirror layer 30 between the region of the shunt resonator branch and the region of the series resonator branch.

Figure 9:
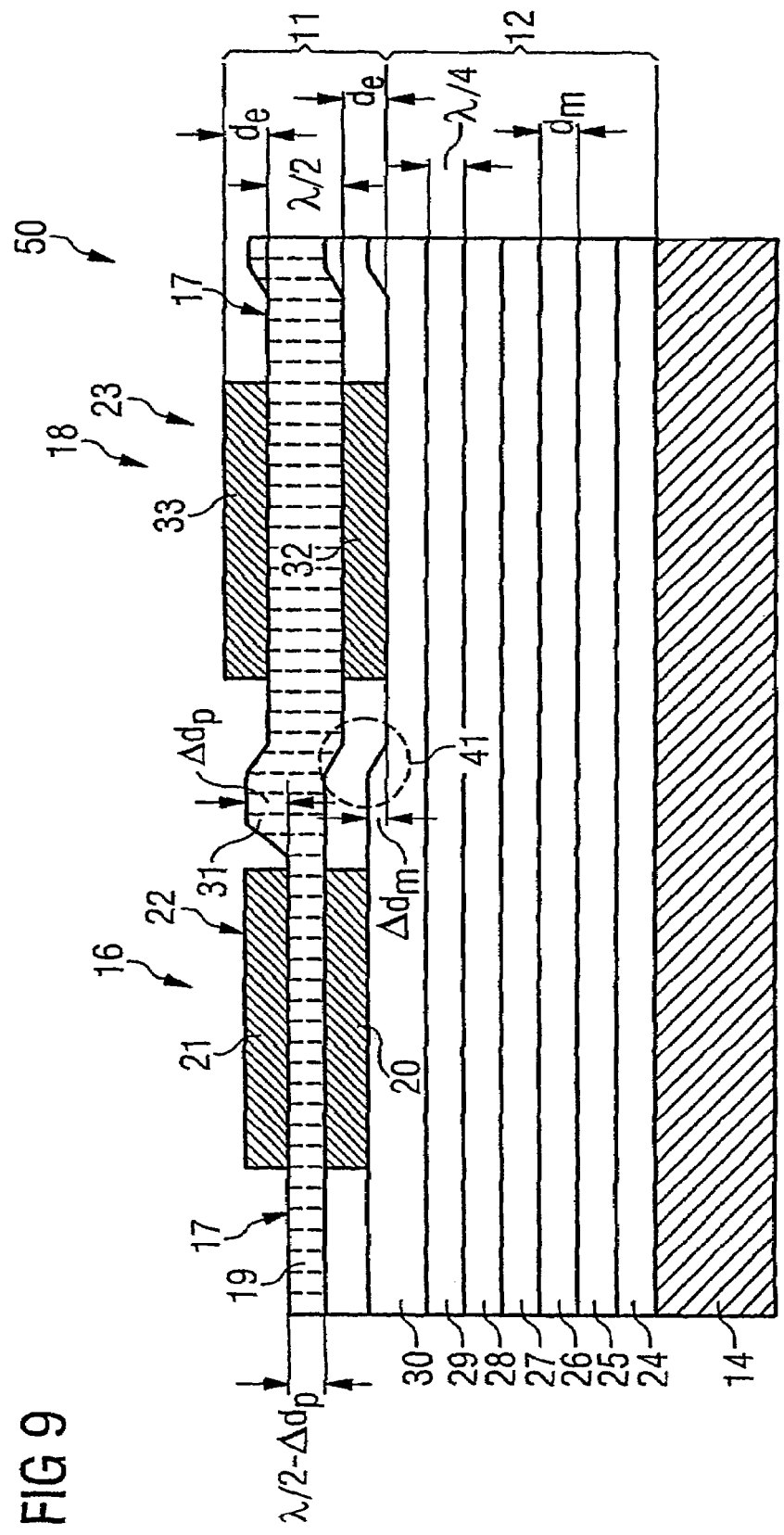
FIG. 9 shows a schematic of an acoustic mirror type bulk acoustic wave resonator filter according to a second embodiment of the present invention.
Figure 10:
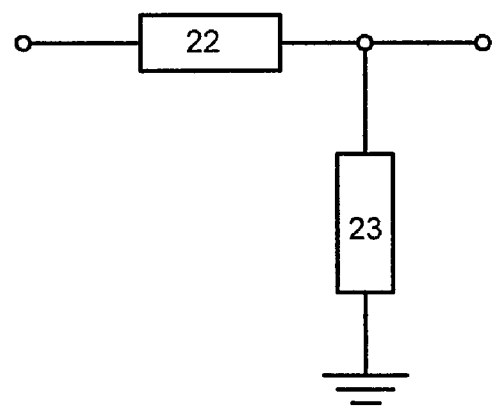
FIG. 10 shows a typical branch of a ladder filter.
Figure 11:
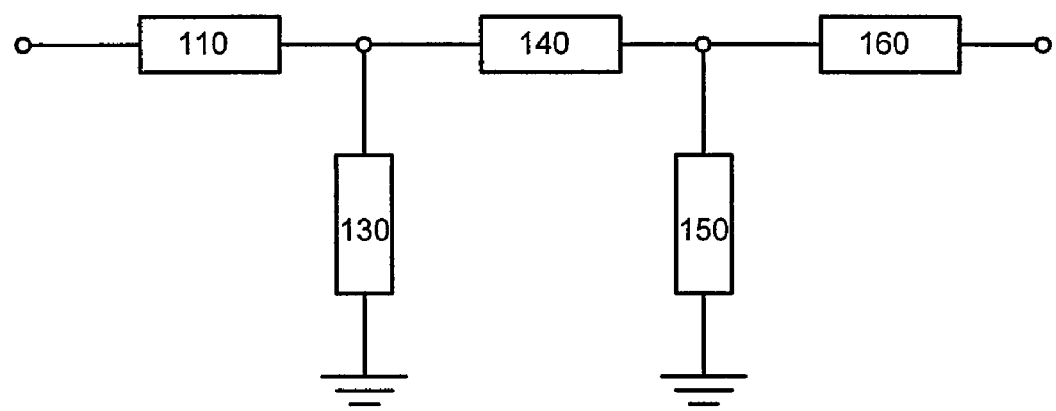
FIG. 11 shows an exemplary network with T-Cells.

FIG. 9 shows a schematic of an acoustic mirror type thin film bulk acoustic wave resonator filter 50 according to a second embodiment of the present invention. In the second embodiment of the present invention the thickness of all electrodes 20, 21, 32 and 33 remain unchanged having no detuning component on top. The detuning component 31 of this second embodiment of the present invention is provided by a thickness difference $\Delta d_p$ of the thickness dp of the piezolayer 19 in the range of one-tenth to one-twentieth in the region of the series resonator branch 22. While this detuning for a precise passband for the first or fundamental resonance frequencies is established in the piezolayer 19, the overmode-detuning for suppressing the side-passband by a overmode-detuning component 41 is achieved similarly to the first embodiment according to FIG. 4 of the present invention.

We claim:
1. A bulk acoustic wave filter comprising
a substrate, carrying:
a set of piezoelectric series resonator means having a thin film resonator structure comprising:
  a piezolayer; and
  bottom electrodes and top electrodes;
a set of piezoelectric shunt resonator means having a thin film resonator structure, similar to said set of series resonator means, wherein
the fundamental resonance frequency is shifted to lower frequencies by applying at least one differential detun- ing layer at a position above a piezo median plane, determining the bandwidth of said bulk acoustic wave filter,
positioned side by side with said set of series resonator means;
acoustic mirror layers positioned between said substrate and said piezoelectric resonator means comprising stacked layers of alternating low acoustic impedance and high acoustic impedance; and
wherein the thin film bulk acoustic wave resonator filter has an overmode-detuning component in which at least one additional differential layer is applied at a position below the piezo median plane for at least one of the series or shunt resonators, and wherein the frequency of the overmode of the series resonators is lowered with respect to the frequency of the overmode of the shunt resonators to provide overmode detuning.

2. The bulk acoustic wave filter of claim 1, wherein the piezolayer is a layer comprising crystalline CdS, PZT, AlN and/or ZnO.

3. The bulk acoustic wave filter of claim 1, wherein the piezolayer has a thickness of about one quarter of a wavelength of an acoustic resonance frequency, and wherein said piezo median plane is located at a thickness of about one eighth of said wavelength.

4. The bulk acoustic wave filter of claim 1, wherein the stack of acoustic mirror layers comprises 2 to 8 low acoustic impedance layers and 1 to 7 high acoustic impedance layers.

5. The bulk acoustic wave filter of claim 1, wherein said stack of acoustic mirror layers comprises as low acoustic impedance material $SiO_2$ and as high acoustic impedance material one of the group $Si_3N_4$, AlN, Cr, W or Mo.

6. The bulk acoustic wave filter of claim 1, wherein said acoustic mirror layer has a thickness of about one quarter of said wavelength of said acoustic resonance frequency.

7. The bulk acoustic wave filter of claim 1, wherein said overmode-detuning component provides a mismatch of the thickness of said bottom electrodes beneath said piezo median plane.

8. The bulk acoustic wave filter of claim 1, wherein said overmode-detuning component provides a mismatch in the thickness beneath said piezo median plane of at least one of said acoustic mirror layers in the regions of said shunt resonators and/or said series resonators having a thickness mismatch in a range of about one-three-hundredth part to one-fiftieth part of one quarter of said wavelength of said acoustic resonance frequency.

9. The bulk acoustic wave filter of claim 1, wherein said top electrodes and said bottom electrodes comprise a sandwich structure of at least two layers for each electrode, having a first layer in close contact to the piezoelectric layer and a second layer in close contact to the first layer, wherein said first layer is made of high acoustic impedance material compared to said second layer and said second layer is made of high electrical conductivity material compared to said first layer.

10. The bulk acoustic wave filter of claim 9, wherein the mismatch between the thickness of the electrodes is provided by a mismatch of the thickness of said second layer.

11. The bulk acoustic wave filter of claim 9, wherein said first layer is made of W, Mo, Ta or Au preferably of W and said second layer is made of Al, Ag or Cu, preferably of Al.

12. A bulk acoustic wave filter comprising
a substrate, carrying:
a set of piezoelectric series resonator means having a thin film resonator structure comprising:
a piezolayer; and
bottom electrodes and top electrodes;
a set of piezoelectric shunt resonator means having a thin film resonator structure, similar to said set of series resonator means, wherein
the fundamental resonance frequency is shifted to lower frequencies by applying at least one differential detuning layer at a position above a piezo median plane, determining the bandwidth of said bulk acoustic wave filter,
positioned side by side with said set of series resonator means;
acoustic mirror layers positioned between said substrate and said piezoelectric resonator means comprising stacked layers of alternating low acoustic impedance and high acoustic impedance; and
wherein the thin film bulk acoustic wave resonator filter has an overmode-detuning component in which at least one additional differential layer is applied at a position below the piezo median plane for at least one of the series or shunt resonators, wherein said overmode-detuning component provides a mismatch of the thickness of said bottom electrodes beneath said piezo median plane, and wherein the frequency of the overmode of the series resonators is lowered with respect to the frequency of the overmode of the shunt resonators to provide overmode detuning.

13. A method of producing a bulk acoustic wave filter comprising the steps:
providing a substrate;
depositing on said substrate stacked acoustic mirror layers of alternating low acoustic impedance and high acoustic impedance;
performing on top of said acoustic mirror layers a set of piezoelectric series resonator means and a set of piezoelectric shunt resonator means, both sets having bottom electrodes toward the acoustic mirror layers and top electrodes;
detuning the bandwidth of said bulk acoustic wave filters by shifting a fundamental resonance frequency to lower frequencies by applying at least one differential detuning layer at a position above a piezo median plane; and
adding an overmode-detuning component by implementing one additional differential layer at a position below said piezo median plane for at least one of the series or shunt resonators, wherein the frequency of the overmode of the series resonators is lowered with respect to the frequency of the overmode of the shunt resonators to provide overmode detuning.

14. The method of claim 13, wherein said step of detuning is performed by thinning the piezolayer by selectively etching piezoelectric material from one or more of said resonators to reduce resonator thickness and to determine the bandwidth of said bulk acoustic wave filter.

15. The method of claim 14, wherein said step of selective etching produces a desired shape of the filter's bandpass response.

16. The method of claim 15, wherein each of said resonators is formed by interposing piezoelectric material between electrodes on a die, and wherein said step of detuning includes removing piezoelectric material from regions to form thin film resonator components.

17. A method according to claim 13 for detuning thin film resonator filters formed from a plurality of thin film resonator components that are manufactured using thin film techniques on a single substrate and coupled in a network, wherein each of said plurality of thin film resonator components are fabricated with a required set of differing resonance frequencies to provide a filtering function by increasing the resonance frequency sets of certain thin film resonator components from a global starting value, said step of increasing effected by selectively etching piezoelectric material from said certain thin film resonator components to reduce thin film resonator component thickness, said removal of piezoelectric material up-shifting the resonance frequency sets of certain thin film resonator components having said reduced component thickness with respect to resonance frequency sets of other thin film resonator components in the filter.

18. The method of claim 17, wherein said plurality of thin film resonator components are coupled in series and shunt branches of the filter to form said network.

19. A method according to claim 13 for detuning a ladder filter formed from a plurality of connected thin film resonator T-cells, each T-Cell containing a plurality of thin film resonator components, coupled in series and shunt branches, each of said thin film resonator components having a set of resonance frequencies, comprising: shifting the set of resonance frequencies of thin film resonator components in the series branches of the T-Cells upward with respect to resonance frequencies in the shunt branch thin film resonator components by removing piezoelectric material from a surface of the series branch thin film resonator components.

20. The method of claim 19, wherein each of said thin film resonator components is formed by interposing piezoelectric material between electrodes on a substrate, and wherein said step of detuning includes removing piezoelectric material from regions which will form series thin film resonator components and/or said substrate, excluding that piezoelectric material in regions which will form shunt thin film resonator components.

21. A method according to claim 13 for detuning a thin film resonator filter formed from a plurality of thin film resonator components electrically connected in series and shunt branches, each of said plurality of thin film resonator components including a piezolayer of piezoelectric material interposed between two electrodes and each thin film resonator component having a set of resonance frequencies, comprising: shifting the set of resonance frequencies of thin film resonator components in the shunt branches of the filter down with respect to the series branch thin film resonator components by depositing additional piezoelectric material in a region which forms the shunt branch thin film resonator components.

22. A method according to claim 13 comprising the step of decreasing the thickness of the uppermost acoustic mirror layer of the shunt resonators with respect to the thickness of the uppermost acoustic layer of the series resonators.

23. A method according to claim 13 comprising the step of increasing the thickness of the uppermost acoustic mirror layer of the series resonators with respect to the thickness of the uppermost acoustic layer of the shunt resonators.

24. A bulk acoustic wave filter comprising
a substrate, carrying:
a set of piezoelectric series resonator means having a thin film resonator structure comprising:
a piezolayer; and
bottom electrodes and top electrodes;
a set of piezoelectric shunt resonator means having a thin film resonator structure, similar to the set of series resonator means, wherein
the fundamental resonance frequency is shifted to lower frequencies by applying at least one differential detuning layer at a position above a piezo median plane, determining the bandwidth of the bulk acoustic wave filter,
positioned side by side with the set of series resonator means;
acoustic mirror layers positioned between the substrate and the piezoelectric resonator means comprising stacked layers of alternating low acoustic impedance and high acoustic impedance; and
wherein the thin film bulk acoustic wave resonator filter has an overmode-detuning component in which at least one additional differential layer is applied at a position below the piezo median plane for at least one of the series or shunt resonators, wherein the overmode-detuning component provides a thickness mismatch in one or more of the acoustic mirror layers beneath the piezo median plane, and wherein the frequency of the overmode of the series resonators is lowered with respect to the frequency of the overmode of the shunt resonators to provide overmode detuning.

25. The bulk acoustic wave filter of claim 24, wherein the overmode-detuning component provides a thickness mismatch in one or more of the uppermost acoustic mirror layers beneath the piezo median plane.

* * * * *